United States Patent [19]

Tabarelli et al.

[11] Patent Number: 4,592,650
[45] Date of Patent: Jun. 3, 1986

[54] APPARATUS FOR PROJECTING A PATTERN ON A SEMICONDUCTOR SUBSTRATE

[75] Inventors: Werner Tabarelli, Vaduz; Herbert E. Mayer, Eschen, both of Liechtenstein

[73] Assignee: Perkin-Elmer Censor Anstalt, Vaduz, Liechtenstein

[21] Appl. No.: 693,902

[22] Filed: Jan. 23, 1985

[30] Foreign Application Priority Data

Jan. 23, 1984 [DE] Fed. Rep. of Germany ....... 3402177

[51] Int. Cl.⁴ .............................................. G03B 27/42
[52] U.S. Cl. ........................................ 355/53; 355/43; 355/54
[58] Field of Search ............................. 355/53, 54, 43

[56] References Cited

U.S. PATENT DOCUMENTS 4,357,100  11/1982  Mayer et al. ........................... 355/43
4,405,229   9/1983  Mayer .................................... 355/53
4,498,762   2/1985  Uehara et al. ......................... 355/55

FOREIGN PATENT DOCUMENTS 2905635  8/1980  Fed. Rep. of Germany .

*Primary Examiner*—Monroe H. Hayes
*Attorney, Agent, or Firm*—Karl F. Ross; Herbert Dubno

[57] ABSTRACT

An apparatus for determining the focus state of a system for the projection exposure of a mask on a semiconductive substrate for producing integrated circuits without relatively displacing the mask, projection objective and substrate along the common optical axis, utilizes an arrangement for varying cyclically the optical path length for rays at least arising from a projected image on the substrate and running through the objective to a detector plane so that an intensity measurement of the light intensity at this plane indicates the path length required for sharpness and hence the focus state of the projection assembly.

10 Claims, 8 Drawing Figures

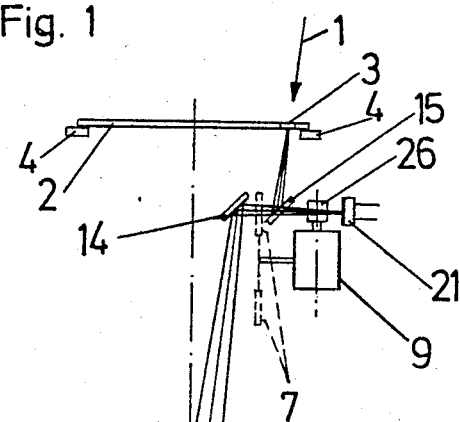
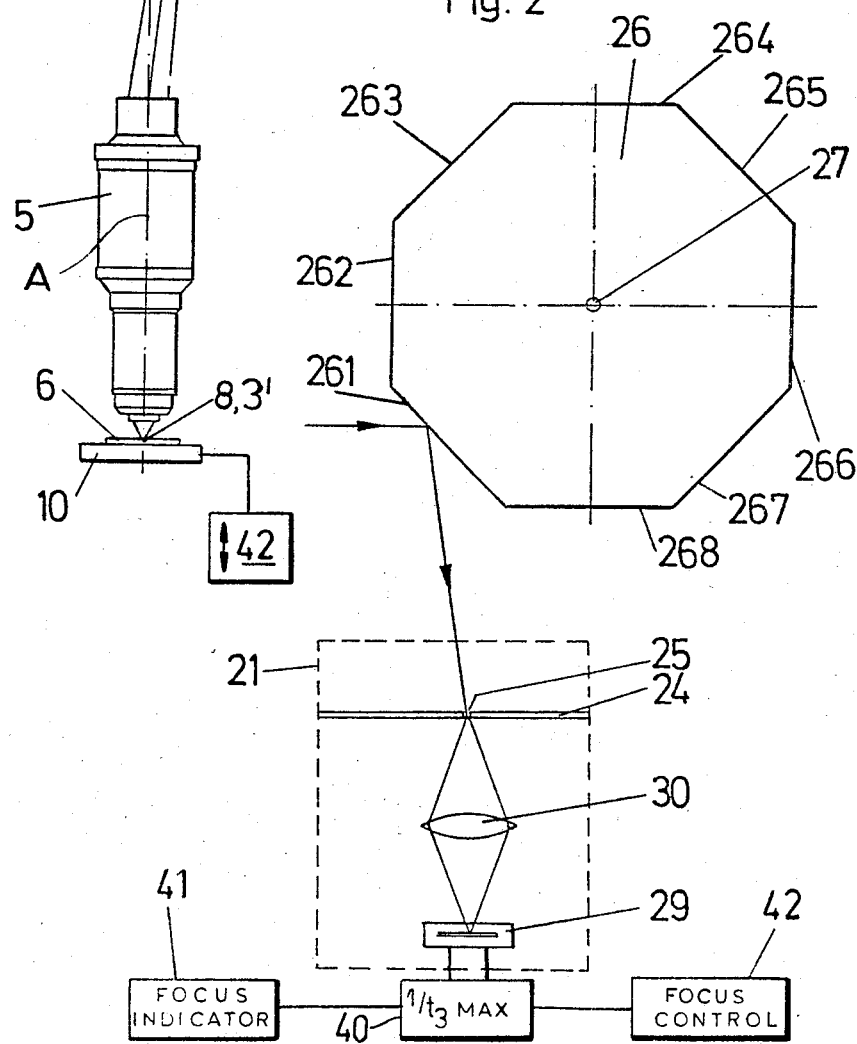

APPARATUS FOR PROJECTING A PATTERN ON A SEMICONDUCTOR SUBSTRATE

FIELD OF THE INVENTION

The present invention relates to an apparatus for projecting a pattern on a semiconductor substrate for the production of miniature semiconductor components and especially integrated circuits, the projected pattern being represented by a mask which defines, by opaque and transparent regions, the zones of the substrate to be exposed.

BACKGROUND OF THE INVENTION

In the production of semiconductor circuits and especially integrated circuits, it is a common practice to transfer a pattern to a semiconductive substrate by an optical system which focuses a greatly reduced image of a mask upon this substrate. The substrate can be made photosensitive by an appropriate coating and can be activated through the imaging process.

In general, the apparatus utilized for this purpose includes a mask having opaque and transparent regions in accordance with the pattern, a light source for transluminating the mask, an objective lens system for focusing the transluminating beam upon a portion of the semiconductive substrate, and if desired, means for repeatedly imaging the mask for coupling the pattern thereon on successive portions of the substrate, each portion of which is adapted to form a respective integrated circuit upon coating of the substrate to isolate these portions.

Alternatively, the patterns may be reproduced on a substrate to form a large-scale integrated circuit.

Essential to the process is the sharp focusing of the image of the mask upon this substrate. To this end, means may be provided, utilizing the projection objective, for focusing a portion of the image on the substrate, onto a detector plane which allows the sharpness of the projected image to be determined. This latter projection can be termed a back projection through the objective lens system.

In the apparatus described in German patent document -- Open Application No. DE-OS 29 05 635, the back-projected image is an image of two parallel edges defining a window and associated in turn with alignment marks of the mask.

The means for back-projecting the image includes a semitransparent mirror disposed between the mask and the projection objective which trains the back-projected image on an evaluation means sensing the back-projected image in a detection plane which is normal to the edges of the window.

The evaluating circuit produces electrical signals proportional to the intensity of the image, and the slope of the electrical signals corresponding to the window edges is evaluated with the resulting value being used to control the relative positions of the mask and the workpieces or substrate in the direction of the optical axis.

The image upon the substrate, whose sharpness is determined by the focusing conditions and which is to be determined by the means just described, need not, however, include or consist of an image of the alignment marks of the mask and thus it is possible to provide the mark upon the substrate itself and to evaluate the sharpness and focus in terms of the gradient of the sensed patterns so that the resulting electrical signals will be a measure of the focusing state of the device.

With the conventional apparatus, a deviation in the position of the substrate from its ideal position in the direction of the optical axis may be detected so that the substrate is shifted in position until the slope of the intensity measurement of the image of the pattern reaches a maximum value. The disadvantage of this system is that a substrate generally must be shifted beyond this optimum value before the optimum value is detected and thus must be returned in the opposite direction. In other words, the actual positioning of the substrate requires a hunting adjustment; typically during adjustment a number of shifts of the substrate in the direction of the optical axis may be required in a time-consuming process.

OBJECTS OF THE INVENTION

It is the principal object of the present invention to provide an adjusting and/or control system for an apparatus for copying a mask pattern upon a semiconductive substrate whereby the disadvantages of earlier systems are avoided.

Another object of this invention is to provide an apparatus for the purposes described which eliminates the need for multiple shifting of the substrate in the direction of the optical axis during the focusing process.

Yet another object of this invention is to improve upon the focusing operation while retaining the advantage of the above mentioned earlier system whereby the appraisal of the focusing state by sensing an intensity profile normal to the optical axis can be carried out, this sensing being required in any event for the positioning of the substrate in the horizontal plane.

SUMMARY OF THE INVENTION

It has now been found that the state of focus can be detected in a system of the type described previously without shifting the substrate for this purpose if, in accordance with this invention, the optical path length of rays at least from the substrate pattern to the detector is selectively varied by different increments.

By so doing, it is possible to detect the optimum path length, moreover, representing the desired focus and, since the increment or increments by which this path length has been varied is known, a corresponding adjustment of the relative positions of the mask, the objective and the substrate can be varied in a single operation to adjust the focus, thereby obviating the hunting or back-and-forth movement of the substrate along the optical axis as previously described.

To vary the optical path length from the image upon the substrate of the rays deriving therefrom, various techniques can be used as described. The change in the optical path length of the rays coming from the image upon the substrate means that the sharpness of the image of the substrate image cast upon the detector will also change. In effect, therefore, the change in the optical path length represents or is equivalent to a shift of the nonmoving substrate in the direction of the optical axis and, of course, an actual shift of an amount corresponding to the virtual shift taking into consideration, of course, that the reduction ratio of the projection objective can be utilized to change the projection path length under the control of the results obtained with the present invention.

One way of changing the optical path length in increments of the ray from the pattern projected on the substrate is to provide a set of plane-parallel glass plates of different thicknesses on a rotatable disk and to interpose these glass plates in turn in the path of the light ray from the projected pattern on the substrate. In that case, it is advantageous to direct the ray which is incident upon the substrate to form a pattern thereon as well as the ray reflected from this substrate onto the detector through each glass plate in turn.

With an appropriate plate thickness, one will obtain the sharpest image of the window in the mask through which the exposing ray passes upon the substrate surface and hence upon the detector, and the thickness of this plate, corresponding to the change in path length, can be used as a measurement for the change in position of the substrate for the desired focus. Alternatively, the image of the window as projected upon the detector will define the actual focus state upon the substrate.

The invention can be carried out in a conventional apparatus by providing a rotary mirror, which does not lie in the path of the ray of the adjusting light directed upon the substrate, to form an image of the pattern on the substrate through a slit located in the detector plane. In this case, the change in the optical path length of the ray reflected from the mirror surface of the rotary mirror can derive from different distances from the axis of rotation thereof. The mirror surfaces which can be located symmetrically with respect to the axis of rotation can be provided, alternatively, by a set of plane-parallel glass plates which are not reflective at their outer surfaces but are reflective only along the inner surfaces so that each light ray passes twice through the thickness of each glass plate.

This arrangement has the advantage that the lateral shift of the image cast on the detector is minimized and the calculated evaluation of the measurements can be simplified.

A certain difficulty with embodiments of the invention in which only the light ray from the pattern on the substrate to the detector is subjected to variation in path length is that an unsharp image of the window edges of the mask will remain unsharp as long as the substrate has a tendency toward scattering the light or of diffusion. The variation in the optical path length from such an unsharp image on the substrate must be taken into consideration in the mesurements so that actually the measurements of the image which is the least unsharp is determined.

If the unsharpness of the pattern projected upon the substrate of the window in the mask is too great, sharply defined marks may have to be provided on the substrate, with the focusing being effected with respect to the projected images of these marks on the detector plane.

BRIEF DESCRIPTION OF THE DRAWING

The above and other objects, features and advantages of the present invention will become more readily apparent from the following description, reference being made to the accompanying drawing in which:

FIG. 1 is an elevational view partly taken obliquely of the significant elements of a conventional projection coupling device for producing integrated circuits and in which the invention can be incorporated as shown in dot-dash lines;

FIG. 2 is a diagrammatic horizontal section of a detail of FIG. 1;

SPECIFIC DESCRIPTION

Figure 3:
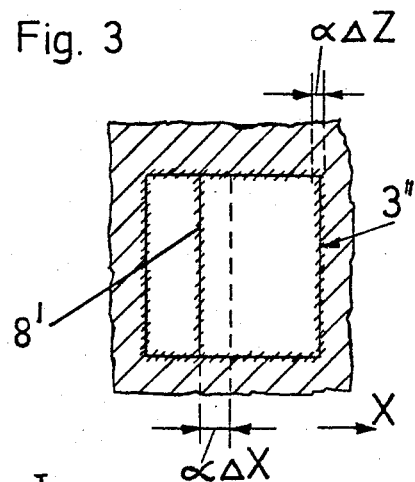
FIG. 3 is a representation of the image of a predetermined pattern on the substrate in which locations are correlated with the time graph of FIG. 3A.

The apparatus shown in FIG. 1 serves to provide an image of a mask 2, composed of transparent and opaque regions, upon a substrate 6, the mask being held in a frame 4. This image is projected by a reducing projection objective 5 upon the substrate 6 which is carried by a table 10 and may be coated with a photosensitive material responding to the projected mask to permit the production of integrated circuits by methods well known in the art.

For the production of integrated circuits it is generally necessary to project the mask image in a succession upon different, e.g. contiguous, regions of the substrate and for the purpose the supporting table 11 can be stepped along X and Y coordinates perpendicular to one another and in the horizontal plane.

For this reason, it is imperative that there be precise alignment of the mask 2 and the substrate 6.

This orientation is effected in a conventional apparatus, i.e. an apparatus of German open application No. 29 05 635, utilizing a pair of mirrors 14, 15 which are disposed in a region in which they clear the path of the projected light beam upon the substrate for exposure purposes, i.e. the exposure light beam, so that they do not disturb the exposure. These mirrors are, however, disposed in the path of an adjusting light beam 1 which typically has a wavelength of 547 or 578 nanometers (nm) and which is selected so as not to affect the photosensitive lacquer applied to the substrate 6.

The beam 1 is projected through a window 3 in the mask 2.

The adjusting beam traverses the semitransparent mirror 15 and the reflecting mirror 14 and is trained by the projection objective 5 upon the substrate 6.

The substrate is provided with a dark mark 8 in a highly reflecting background.

The outline of the window is thereby projected on this background around the dark mark 8 as illustrated diagrammatically in FIG. 3 upon the substrate as an adjusting pattern.

Figure 5:
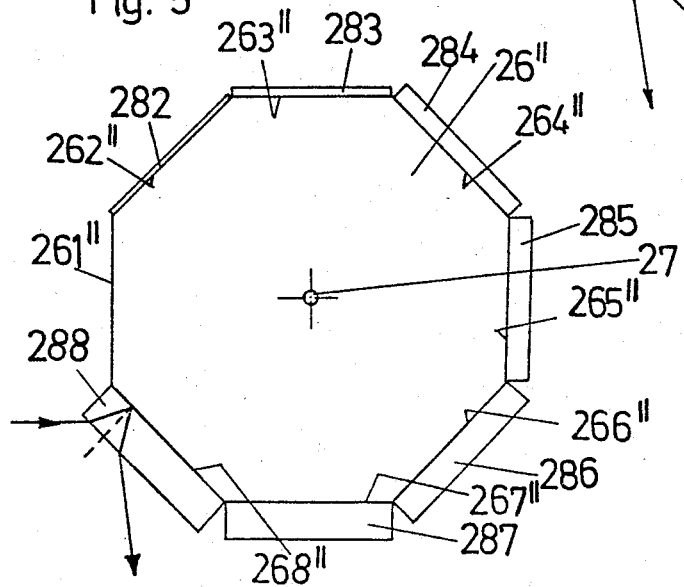

An image of this adjusting pattern is thus cast via the mirror 14 through the semitransparent mirror 15 upon the rotary mirror 26. The latter, shown in detail in FIG. 5, is rotated about an axis 27 so that the back projected image 3" of the mark 3 and the image 8' of the mark 8 are applied to the detector plane 24 of the detector 1 which has a slit 25 in this plane.

A lens or objective system 30 (FIG. 2) directs the light traversing this slit upon a photodetector or sensor 29 which provides an electrical signal whose magnitude is proportional to the light amplitude. The image shown in FIG. 3 is thereby scanned in the X direction. The signal thus generated increases initially when the back-projected image of the window 3 falls in the region of the slit 25 and sinks during the interval $t_1$ when the light falls upon the photodetector is darkened as the scanning reaches the mark 8. From the ratio $t_1:t_2$, the deviation of the mark 8 from its ideal position can be determined, it being understood that this mark should lie precisely in the center of the image 3' of the window 3 upon the substrate in the ideal position.

This orientation or positioning approach is utilized successfully in the method and apparatus of the aforementioned German patent document to determine the ideal position of the substrate; the focusing state of the apparatus can also be determined.

Specifically, when the image 3' of the edges of the window upon the substrate 6 is sharp and is sharply defined upon the detector plane 24, the time $t_3$ representing the rise time of an edge signal is extremely short, the desired degree of sharpness is realized.

The longer the absolute value of the time $t_3$, the greater is the degree of unsharpness and hence deviation from precise focus. Similarly, the width of the trough of the curve in FIG. 3a, representing the width of the darkened zone represented by the mark 8, is a measure of the deviation from perfect sharpness and hence a measure of the outer focus character of the assembly.

Figure 3A:
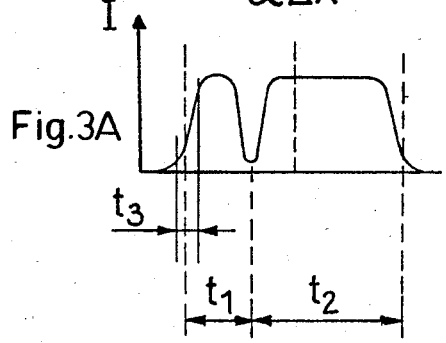
FIG. 3A is a graph plotted measuring the amplitude of the detector output signal along the ordinate versus time plotted along the abscissa for the image of FIG. 3.

If a precise determination of the slope of the rising flank or of the width of the trough in FIG. 3a could be made and correlated with the degree of displacement necessary to achieve perfect focus, the problem encountered in the prior art system could be obviated.

In the past only repeated back and forth movements of the substrate plane in a hunting approach to minimize, say, the width of the darkened zone, i.e. the spread of the trough of the curve could be utilized for focus adjustment.

According to the invention, however, a different approach is used, i.e. an approach which allows substantially the absolute value of the rise time or slope of the segment $t_3$ of the curve to be determined and thus provides with a high degree of reliability an accurate determination of the deviation of the position of the substrate 6 from its ideal position along the optical axis.

The incremental movement of the substrate back and forth through diplacements in the micron range in a time-consuming hunting operation can be entirely avoided.

Indeed, the heart of the invention is that it is able to determine the focus state, i.e. the degree of deviation of the substrate 6 from its perfect focus or ideal position along the optical axis, without this hunting movement of the substrate.

This is achieved by the controlled variation of the optical path length from the mark 8 or 3", i.e. the adjusting image upon the substrate 6 and upon the detector plane so as to define the degree to which the mask, the objective and the substrate must be moved relatively along the optical axis to achieve true focus.

Figure 4:
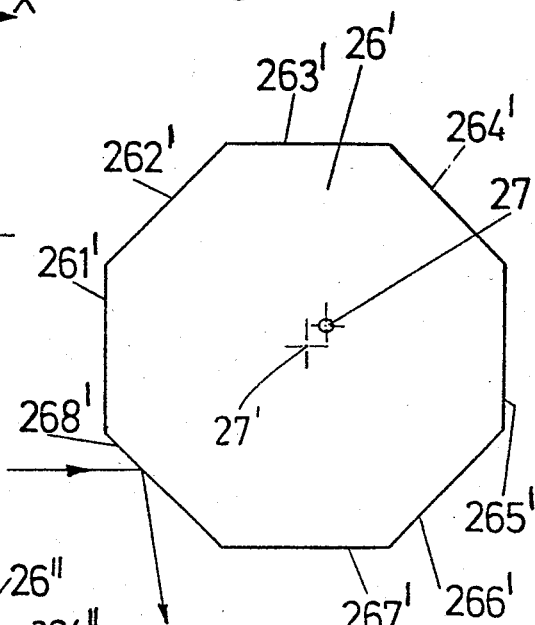
FIGS. 4 and 5 are elevational views showing modifications of the rotary mirror of FIG. 2 in accordance with other aspects of the invention.

As shown in FIG. 4 this can be done simply by offsetting the axis of rotation 27 of the mirror 6 eccentrically with reference to the true center 27' of the rotating mirror.

The mirror surfaces 261'–268' thus produce images 8', 3" of the pattern 8, 3' from the substrate 6 upon the detector 21 at different locations for each of the mirror surfaces with a different sharpness image upon the detector 21.

Figure 7:
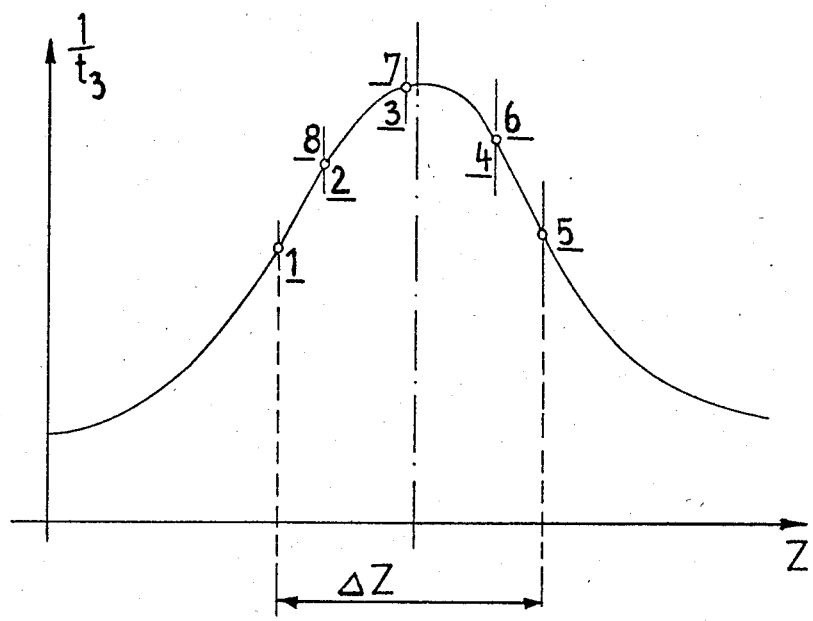
FIG. 7 is a diagram in which the sharpness or lack of sharpness of the image registered by the detector in dependence upon the optical path length of the ray from the adjustment pattern on the substrate to the detector is shown.

If one refers to FIG. 7 in which the value of the reciprocal of $t_3$ (i.e. $1/t_3$) is plotted along the ordinate against the intensity path length Z, it can be seen that the resulting curve has a maximum at one of the mirror surface settings at which the image of the pattern has a maximum sharpness.

Theoretically the entire apparatus can be focused taking this determination as a basis by shifting the mask 2 by a corresponding amount, i.e. an amount corresponding to the path length change represented by the maximum of the curve in FIG. 7. In practice, however, the spacing between the mask 2 and the projection objective 5 is generally held constant and the substrate 6 is moved along the optical axis by a corresponding amount since the projection objective 5 is only telecentric on this substrate.

Expressed otherwise because of the offset between the axes 27 and 27', each of the points 1–5 is generated by impingement of a ray upon a mirror surface 261'–268' at a progressively increasing distance from the mirror 15, thereby increasing the path length in stepwise manner. Because of the nature of an eccentric drum, the next three points 6–8 represent path lengths which have been shortened by corresponding increments. At the path length corresponding essentially to the points 3 and 7 in FIG. 7, an optimum representing sharpest focus is obtained, i.e. the reciprocal of $t_3$ is a maximum which means that $t_3$ is a minimum. A minimum $t_3$ corresponds to greatest sharpness of focus. The total range of displacement of the path length is represented at $\Delta Z$ and since the displacement corresponding to points 3, 7 is known, the substrate 6 can be moved axially along the optical axis to increase the actual path length by the equivalent of three increments of the increased path length generated by the eccentric reflector drum to guarantee a sharp focus for the subsequent exposure.

FIG. 5 shows another device which functions generally similarly except that seven increments of path length change can be generated with each rotation of the drum. Here the mirror surfaces 261"–268" are all at the same distance from the axis of rotation 27 of the drum. The different optical path lengths of the pattern from the substrate 6 of the detector 21 are generated by effectively increasing the path length immediately ahead of the reflective surface and immediately beyond the reflective surface by providing on these surfaces respectively a plurality of plane parallel glass plates 282–288 of different thicknesses and thicknesses which increase in a stepwise manner with successive reflective surfaces. As has been illustrated in FIG. 5, the ray of light from the pattern on the substrate 6 directed upon the detector 21 must pass twice through each glass plate and the corresponding refractive indices and thickness of these plates increases the path length from one reflective surface to the next.

The embodiments of FIGS. 4 and 5 have the advantage that either of them requires only the most minor changes in the conventional configuration of the apparatus.

Figure 6:
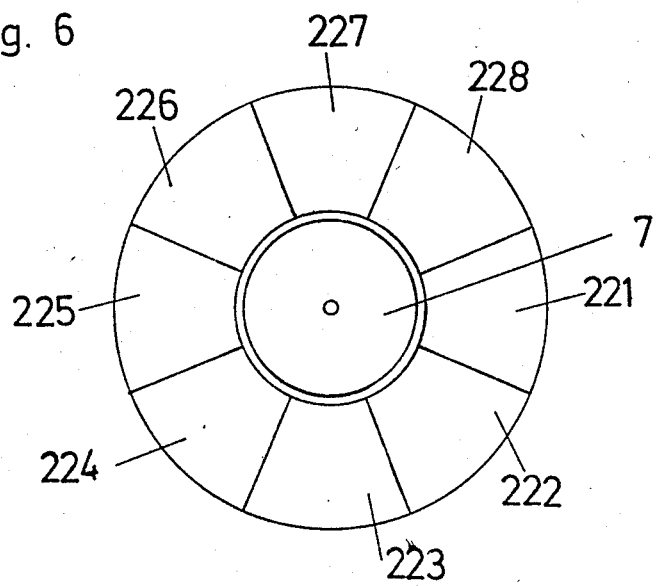
FIG. 6 is an elevational view of a turntable or disk having a plurality of plane-parallel glass sectors of different thicknesses for use in the apparatus shown in FIG. 1.

In some cases, however, the construction shown in broken lines in FIG. 1 may be even more advantageous. In this construction, a disk 7 provided with windows of plane parallel glass of respective thicknesses, e.g. the sectoral glass planes 221–228 shown in FIG. 6, may be used, these windows being successively positioned in the path light rays between the mirror 14 and the semitransparent mirror 15. The disk 7 is driven synchronously with the rotary multifaceted mirror 26 of FIG. 2 by the same drive 9.

By the incremental cyclical changes in path length afforded by the interpositon of the different panes 221–228 in succession in the path, utilizing the principles already described, it is possible to determine the change in path length which corresponds to a sharp image of 3' of the window 3 upon the substrate 6 as well as a sharp image of the pattern 8, 3' of the substrate 6 upon the detector plane 24. The monitoring circuitry can automatically determine the maximum value $1/t_3$ and thus the change in path length corresponding to the maximum and thereby indicate the focusing state or, indeed, automatically adjust the focus.

To this end, the detector 129 can be provided with a peak analyzer 40 determining the $1/t_3$ max and an indicator 41 for the state of focus as well as a focus control 42 for shifting the substrate 6 along the optical axis A by the appropriate amount required for best focus.

The computer 40, 42 serving for this purpose can automatically compensate for the different refractive power of the objective 5 for the exposure and adjustment light frequencies. The mirror pair 14, 15 need not be considered in this respect since they involve only adjusting the light rays.

If the mirror pair 14, 15 is not provided, the ultimate shift of the substrate must take into consideration also the dependence upon the refractive power of the objective upon the light wavelength.

What is claimed is:

1. In an apparatus for projecting a mask upon a semiconductive substrate to produce integrated circuits wherein a projection objective has an optical axis along which the substrate and the mask are disposed and, to determine the focus state, the sharpness of an image through the projection objective from the substrate on a detector plane is monitored, the improvement which comprises:

means for varying the optical path length without shifting of said substrate at least from a pattern on said substrate to a detector of rays passing from said pattern on said substrate through said objective to said detector by different increments; and
   means connected to said detector for determining the path length corresponding to maximum sharpness of the image from said pattern on said substrate as a measure of said focus state.

2. The improvement defined in claim 1 wherein said means for varying said optical path length includes a set of plane parallel glass plates of different optical transmission thicknesses transluminated by said rays and means for interposing said plates in succession in the path of adjusting light rays cast upon said substrate to form said pattern thereon and reflected from said substrate to said detector.

3. The improvement defined in claim 2 wherein said plates are mounted on a rotatable disk.

4. In an apparatus as defined in claim 1 wherein a rotary multifaceted mirror casts an image of said mask through a slit upon said detector plane, the improvement wherein each of a plurality of mirror surfaces of said rotary mirror defines different path lengths for rays passing from said mask to said substrate and from said detector of said plane.

5. The improvement defined in claim 4 wherein said rotary mirror is rotatable about an axis of rotation offset from a center of said rotary mirror.

6. The improvement defined in claim 4 wherein each of said surfaces is provided with a respective plane parallel glass plate of a respective light-transmission thickness.

7. The improvement defined in claim 3 wherein said plates have different thicknesses.

8. The improvement defined in claim 3 wherein said plates have different refractive indices.

9. The improvement defined in claim 6 wherein said plates have different thicknesses.

10. The improvement defined in claim 6 wherein said plates have different refractive indices.

* * * * *

Dedication

4,592,650.—*Werner Tabarelli*, Vaduz; *Herbert E. Mayer*, Eschen, both of Liechtenstein. APPARATUS FOR PROJECTING A PATTERN ON A SEMICONDUCTOR SUBSTRATE. Patent dated June 3, 1986. Dedication filed Feb. 20, 1990, by the assignee, Mercotrust Aktiengesellschaft.

Hereby dedicates to the Public the remaining term of said patent.
[ *Official Gazette April 17, 1990* ]